United States Patent
Kunert

(10) Patent No.: US 9,865,689 B2
(45) Date of Patent: *Jan. 9, 2018

(54) MONOLITHIC INTEGRATED SEMICONDUCTOR STRUCTURE

(71) Applicant: NAsP III/V GmbH, Marburg (DE)

(72) Inventor: Bernardette Kunert, Marbug (DE)

(73) Assignee: NASP III/V GMBH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/882,132

(22) Filed: Oct. 13, 2015

(65) Prior Publication Data

US 2016/0133709 A1 May 12, 2016

Related U.S. Application Data

(63) Continuation of application No. 13/547,249, filed on Jul. 12, 2012, now Pat. No. 9,196,481.

(60) Provisional application No. 61/533,301, filed on Sep. 12, 2011.

(30) Foreign Application Priority Data

Jul. 12, 2011 (DE) .................. 10 2011 107 657

(51) Int. Cl.
*H01L 33/00* (2010.01)
*H01L 29/205* (2006.01)
*H01L 21/02* (2006.01)

(52) U.S. Cl.
CPC ........ *H01L 29/205* (2013.01); *H01L 21/0262* (2013.01); *H01L 21/02381* (2013.01); *H01L 21/02458* (2013.01); *H01L 21/02461* (2013.01); *H01L 21/02463* (2013.01); *H01L 21/02466* (2013.01); *H01L 21/02505* (2013.01); *H01L 21/02538* (2013.01)

(58) Field of Classification Search
CPC ................... H01L 27/0605; H01L 33/0062
USPC ............................................... 257/190
See application file for complete search history.

(56) References Cited

U.S. PATENT DOCUMENTS

| 4,963,508 | A | 10/1990 | Umeno et al. |
|---|---|---|---|
| 6,188,090 | B1 | 2/2001 | Miyagaki et al. |
| 9,196,481 | B2 * | 11/2015 | Kunert ............. H01L 21/02381 |
| 2001/0045659 | A1 | 11/2001 | Farrar |
| 2003/0027099 | A1 * | 2/2003 | Udagawa ................ H01L 33/06 433/79 |

(Continued)

FOREIGN PATENT DOCUMENTS

| DE | 102005004582 | 7/2006 |
|---|---|---|
| WO | 94/10707 | 3/1994 |

*Primary Examiner* — Thomas L Dickey

(74) *Attorney, Agent, or Firm* — Mayer & Williams PC

(57) ABSTRACT

A monolithic integrated semiconductor structure includes: A) an Si carrier layer, B) a layer having the composition $B_xAl_yGa_zN_tP_v$, wherein x=0-0.1, y=0-1, z=0-1, t=0-0.1 and v=0.9-1, C) a relaxation layer having the composition $B_xAl_yGa_zIn_uP_vSb_w$, wherein x=0-0.1, y=0-1, z=0-1, u=0-1, v=0-1 and w=0-1, wherein w and/or u is on the side facing toward layer A) or B) smaller than, equal to, or bigger than on the side facing away from layer A) or B) and wherein v=1−w and/or y=1−u−x−z, and D) a group III/V, semiconductor material. The sum of the above stoichiometric indices for all group III elements and for all group V elements are each equal to one.

17 Claims, 1 Drawing Sheet

C: semiconductor layer

E: hetero-offset layer

D: misfit disloc. blocking layer

B: relaxation layer additional layer

A: carrier layer

(56) References Cited

U.S. PATENT DOCUMENTS

| | | |
|---|---|---|
| 2004/0113155 A1 | 6/2004 | Lai |
| 2008/0073639 A1 | 3/2008 | Hudait |
| 2010/0109049 A1* | 5/2010 | Cheng ............. H01L 21/823412 257/190 |
| 2010/0116942 A1* | 5/2010 | Fitzgerald ......... H01L 31/02167 244/172.7 |

* cited by examiner

C: semiconductor layer

E: hetero-offset layer

D: misfit disloc. blocking layer

B: relaxation layer additional layer

A: carrier layer

MONOLITHIC INTEGRATED SEMICONDUCTOR STRUCTURE

CROSS REFERENCE TO RELATED APPLICATION

This application is a continuation of U.S. patent application Ser. No. 13/547,249, filed Jul. 12, 2012, which claims the benefit of U.S. Provisional Application No. 61/533,301, filed Sep. 12, 2011 and claims the benefit of German Application No. 10 2011 107 657.7, filed Jul. 12, 2011, all of which are incorporated herein by reference.

FIELD OF THE INVENTION

The invention relates to a monolithic integrated semiconductor structure, which is suitable for forming integrated semiconductor components based on the group III/V elements on a silicon substrate, to a method for producing the same and to the uses thereof.

BACKGROUND OF THE INVENTION AND PRIOR ART

The invention of the integrated circuit based on silicon and silicon dioxide has allowed in the last decades an enormous development in microchip processor technology and microelectronics. In an integrated circuit, inter alia, n-channel and p-channel transistors are combined for data processing in the so called CMOS logic (complementary metal oxide semiconductor). Transistors basically are resistances controlled by an external gate voltage. In the last decades, the performance of the integrated circuits could be improved by increasing miniaturization of the transistors and thus by the growing transistor density. In the meantime, however, the dimensions of the individual structures of the transistor components are so small that fundamental physical limits are reached and further miniaturization will not lead to an improvement of the circuits.

Meanwhile, besides silicon and silicon dioxide, new materials are used at this place for producing integrated circuits, the physical properties of said materials leading to an improvement of the functionality. Inter alia, the use of III/V semiconductor materials in the CMOS technology is discussed.

Since the electron mobility of some III/V semiconductor materials is substantially higher than that of silicon and the efficiency or switching speed of n-channel transistors is significantly determined, inter alia, by the electron mobility, the use of III/V semiconductor materials as n-channel layers could lead to a substantial improvement of the integrated circuits. Furthermore, the gate voltage can be reduced by using III/V semiconductor materials, which in turn reduces the energy consumption and thus the heat dissipation in the integrated circuits. At present, various institutes, universities and enterprises investigate the use of III/V channel layers in the silicon technology.

Which III/V semiconductor is most useful for the integration on silicon, is determined, on the one hand, by the fundamental properties of the semiconductor material, such as the electron mobility and the electronic band gap.

On the other end, the compatibility for mass production in the silicon technology must ultimately be considered. Arsenic is a substantial constituent of many III/V semiconductor mixed crystals. Due to the high toxicity of arsenic, an envisaged use of arsenic-containing materials in a large-scale industrial production requires an expensive disposal of the arsenic-containing waste products.

For the integration of III/V semiconductor materials on silicon-based circuits, normally the epitaxy method is employed. In this epitaxial precipitation method, the lattice constants of the crystalline semiconductor materials play a decisive role. The used silicon substrate or the carrier substrate in the silicon chip technology determines the basic lattice constant. Most III/V semiconductor materials with high electron mobility have, however, a different lattice constant from that of silicon, which is normally higher. In the epitaxial integration of III/V channel layers on silicon substrate, this difference of the lattice constants leads to the formation of misfit dislocations in the III/V-semiconductor layer. These dislocations are crystal defects, which significantly deteriorate the electronic properties of the semiconductor layer. In order to assure an optimum material quality of the III/V channel layers, special III/V buffer layers are necessary. These buffer layers are defined by a special sequence of different III/V semiconductor materials and/or by a special production method. Furthermore, this buffer layer must not be too thick, so that the compatibility in the III/V-integration on silicon with the actual CMOS process is assured.

Different buffer layers or matching layers are for instance known in the art from the document DE 103 55 357 A.

Technical Object of the Invention

It is the technical object of the invention to specify an integrated monolithic semiconductor structure, which integrates group III/V semiconductors on silicon substrates, and that under fulfillment of all electronic requirements, under avoidance or reduction of arsenic-containing wastes during the production and under optimized matching of different lattice constants of silicon on the one hand and group III/V semiconductors on the other hand.

BRIEF DESCRIPTION OF THE DRAWINGS

FIG. 1 shows the layers and their stacking.

BASICS OF THE INVENTION

For achieving this technical object, the invention teaches a monolithic integrated semiconductor structure containing the following layer structure: A) a carrier layer based on doped or undoped Si, B) optionally a layer having the composition $B_xAl_yGa_zN_tP_v$, wherein x=0-0.1, y=0-1, z=0-1, t=0-0.1 and v=0.9-1, C) a relaxation layer having the composition $B_xAl_yGa_zIn_u P_vSb_w$, wherein x=0-0.1, y=0-1, z=0-1, u=0-1, v=0-1 and w=0-1, wherein w and/or u is on the side facing toward layer A) or B) smaller than, equal to, or bigger than on the side facing away from layer A) or B) and is variable or constant within the relaxation layer, and wherein v=1−w and/or 1=u+x+y+z, D) optionally a layer for blocking misfit dislocations and having the composition $B_xAl_yGa_zIn_uP_vSb_wN_t$, wherein x=0-0.1, y=0-1, z=0-1, u=0-1, v=0-1, w=0-1 and t=0-0.1, E) optionally a layer for hetero-offset having the composition $B_xAl_yGa_zIn_uP_vSb_wN_tAs_r$, wherein x=0-0.1, y=0-1, z=0-1, u=0-1, v=0-1, w=0-1, t=0-0.1 and r=0-1, and F) a arbitrary group III/V semiconductor material or the combination of several arbitrary semiconductor materials, wherein the sum of the above indices for all group III elements is always 1 and wherein the sum of the above indices for all group V elements is also always 1.

The basis of the invention is a novel combination of existing semiconductor materials and further developments thereof, in order to obtain an optimum buffer layer or matching layer, resp., for the integration of III/V components and in particular channel layers on silicon substrate.

The peculiarity of the invention is the realization of a buffer layer being phosphor (P)-based and low in arsenic (As) or also free of As, which has in addition by the admixture of aluminum (Al) on the group III side in the III/V semiconductor mixed crystal the material property of a relatively large electronic band gap and has on the buffer surface the lattice constant of the n-channel layer with an as small dislocation defects density as possible.

The invention has three decisive advantages over existing integration concepts:

1. The lattice constants of (AlGa)P and silicon are only minimally different. Therefore, thin (BAlGa)(NP) layers with low boron or nitrogen concentration can be epitaxially deposited without the formation of misfit dislocations on (001) silicon substrate. Procedural challenges for the monolithic connection of III/V semiconductor mixed crystals and silicon because of the different crystal properties of the two materials, such as atomic binding properties and lattice base, are solved during the growth of this first thin III/V semiconductor layer. Only in the next step, the lattice constant is increased by the specific admixture of antimony and indium and the formation of misfit dislocations is initiated in a controlled manner. By using a defect-free template, thus the overall layer thickness of the III/V buffer layer can significantly be reduced, which in turn is decisive for the compatibility with the existing CMOS process. Furthermore, thinner layers are less expensive in production.

2. The band gap is a characteristic semiconductor material property depending on the material composition of the III/V crystal and its state of strain. Since the band gap of the III/V material of the n-channel layer is mainly small, there is at the contact face between the buffer layer and the n-channel layer a large hetero-offset in the conduction and/or valence band of the electronic band structure, when the buffer layer has a comparatively large band gap. A large offset in the conduction band is in turn very advantageous for the functionality of an n-channel transistor. In this invention, in particular a large hetero-offset to the n-channel layer is realized.

3. n-channel material systems with optimum properties for the component frequently contain arsenic. These channel layers are however very thin compared to the buffer layer, therefore it is decisive to reduce in particular the arsenic concentration in the thick buffer layers. The use of a phosphor-based buffer allows for the first time a significant reduction of an arsenic-containing compound in the industrial production. Thereby, the costs of the expensive disposal of arsenic-containing waste products can drastically be lowered.

Further, in this integration concept it is taken advantage of that even thin (30-60 nm) boron-aluminum-gallium-nitride-phosphide ((BAlGa)(NP)) layers can be deposited defect-free and without crystal polarity disorder on exactly oriented (001) silicon substrate. Thereby, the necessary buffer layer thickness can significantly be reduced.

This (BGaAl)(NP)—Si template is therefore used as a model for the invention. In the following, the buffer in the embodiment with imperatively established layers C) to E) is subdivided into three layer packages (1-3 or layers C) to E), resp.):

1. The first layer package (relaxation layer C) on the template preferably consists of different individual layers, may however also be one single layer. The composition of these (BAlGaIn)(SbP) individual layers is varied so that many misfit dislocation defects are formed and the lattice constant is systematically increased. Furthermore, special baking methods can be employed, in order to promote the formation of misfit dislocations. It is decisive that the realized lattice constant at the surface of the first layer package corresponds to the target lattice constant for the integration of the channel layer.

2. In the second layer package (layer D)), a misfit dislocation blocker layer is realized. This blocker layer may consist of one or several (BAlGaIn)(PSbN) individual layers with different composition. It is the object of these (BAlGaIn) (PSbN) layers to prevent that misfit dislocations from the first layer package reach the upper III/V layers (layer packages 2 and 3 and the channel layer). Herein, the state of strain of the individual layers is specifically varied. However, no further misfit dislocations are to be produced, and consequently these individual layers are deposited in a pseudomorphously strained manner.

3. In the third layer package (hetero-offset, layer E)), the optimum band gap as well as the optimal hetero-offset for the integration of the channel layer is realized. This last layer package may in turn consist of one or several (BAlGaIn) (PSbNAs) layers. Whereas the first two layer packages are free from arsenic, this last layer package may include a thin arsenic-containing layer. This layer is however comparatively thin (<50 nm), whereby the significant advantage of this invention with regard to the low-arsenic production is still maintained.

In particular, the following variants of the invention are preferred.

The compositions of layers C), D), and E) can be selected so that the lattice constant of one of layers D) and/or E) and/or of the side of layer C) facing away from layer A) or B) substantially corresponds to the lattice constant of layer F).

On the side facing toward layer B) or C), layer A) preferably is a Si (001) surface of a Si monocrystal.

The individual layers preferably have the following features.

Layer B) may have a thickness of 5-100 nm, in particular 30-80 nm, for instance 60 nm, and/or a p- or n-doping concentration of $1*10^{15}$-$1*10^{21}$ cm$^{-3}$, in particular $1*10^{15}$-$1*10^{17}$ cm$^{-3}$, for instance $3*10^{15}$ cm$^{-3}$. Preferably, it has one of the following compositions: z=v=1, x=y=t=0 or y=v=1, x=z=t=0 or x=0.01-0.1, y=0.90-0.99, z=t=0, v=1 or x=0.01-0.1, z=0.90-0.99, y=t=0, v=1 or t=0.01-0.1, v=0.90-0.99, y=x=0, z=1. For instance it is GaP.

In layer C), w and/or u may be monotonically rising or falling from the side facing toward layer A) or B) to the side facing away from layer A) or B) (if w and/or u on the side facing toward layer A) or B) is smaller or larger than on the side facing away). Herein, the term "monotonically rising or falling" means on the one hand in mathematical strictness "strictly monotonically rising/falling", viewed as a function of w and/or u in a direction of a location coordinate extending orthogonally to the surface of layer A) or B). Examples are linear, exponential or any other arbitrary monotonic function. The term may however also comprise functions, in which the value of w and/or u may be, depending on the location, partially constant. An example of this is a (rising or falling) step function, which is obtained when layer C) is produced in partial layers. In principle, it is however not excluded that w and/or u within layer C) has, in sections, changing signs of the slope in a location-dependent concentration distribution. In particular, it is also possible that the function w or u, depending on said location coordinate, has maxima or minima, i.e. the maximum or minimum values thereof may be higher or lower than the values of w or u at the two sides of layer C). It is however also possible that the maximum or minimum values are between the values of w or u at the two sides of layer C). Layer C) may however also consist of an individual layer with a constant composition.

As mentioned above, layer C) may be formed from a multitude of partial layers, in particular 1-30 partial layers, preferably 2-10 partial layers, for instance 6 partial layers, wherein w in turn may be variable or constant within a partial layer (in the direction orthogonal to the surface of layer A) or B)). Layer C) may have a thickness of 1-500 nm, in particular 100-400 nm, for instance 300 nm. The partial layers respectively may have, equally or differently, a thickness from 5 to 500 nm, in particular 10 to 100 nm, for instance 10 to 60 nm. Layer C) or the partial layers thereof may have, in part or in total, a p- or n-doping concentration of $10^{15}$-$10^{21}$ cm$^{-3}$, but may however also be undoped. Layer C) or the partial layers thereof (identical or different) preferably have one of the following compositions: y=1, x=z=u=0, v=1−w or x=z=0, y=1−u, v+w=1. Examples are $AlP_vSb_w$ and $Al_yIn_uP$ or $Al_yIn_uP_vSb_w$. The last-mentioned layer is recommended in particular as last but one partial layer within partial layers otherwise comprising $Al_yIn_uP$, referred to the overlying next layer. This last but one partial layer may for instance have w=0.08 and v=0.92.

Typically, layer D) will have a thickness of 1-150 nm and/or be undoped and/or have a p- or n-doping concentration of $10^{15}$-$10^{21}$ cm$^{-3}$. It may be formed of an individual layer or a multitude of (identical or different) partial layers, in particular 1-10 layers, preferably 2-5 layers, for instance 2. The layer thicknesses of the partial layers may be in the range from 1 to 150 nm, for instance 5 to 100 nm. Layer D) or the partial layers (identical or different) thereof preferably have one of the following compositions: x=0-0.1, y=0.9-1, v=0-0.7, w=0.3-1, z=u=t=0 or u=1, w=0-0.5, v=0.5-1, t=0-0.1, x=y=z=0 or y=1, v=0-0.7, w=0.3-1, t=0-0.1, x=z=u=0 or u=0.9-1, x=0-0.1, v=0.5-1, w=0-0.5, y=z=t=0.

Layer E) or the partial layers thereof (for instance 2 to 5) may have a thickness of 5-200 nm, in particular 10-100 nm or 10 to 50 nm. 1 to 10, preferably 2 to 5, for instance 2, partial layers may be provided, of identical or different composition and/or thickness of the partial layers (thickness of the partial layers: 5-200 nm). It or its partial layers may be undoped and/or have a p- or n-doping concentration of $10^{15}$-$10^{21}$ cm$^{-3}$. Layer E) or its partial layers (identical or different) may preferably have one of the following compositions: y=1, v=0.2-0.5, w=0.5-0.8, x=z=u=t=r=0 or y=1, w=0.4-0.8, r=0.2-0.6, x=z=u=v=t=0.

Doping, if provided, can be made with the elements Si, Te, S, Zn, Mg, Be and/or C. Doping reagents for use in the method described in the following are for instance diethyl tellurium, dimethyl zinc, diethyl zinc, ditertiary-butyl silane, silane, ditertiary-butyl sulfide, bis-cyclopentadienyl magnesium, or tetrabromomethane.

The invention further comprises a method for producing a monolithic integrated semiconductor structure according to one of claims 1 to 15, wherein on a layer A), optionally a layer B) is epitaxially grown, on layer A) or B) a layer C) is epitaxially grown, on layer C) optionally a layer D) and/or E) is epitaxially grown, on layer C) or D) or E) a layer F) is epitaxially grown. One layer or several of layers A), B), C), D), E), and/or F) may be p- or n-doped, but may also in particular be undoped.

In particular, a method according to the invention may comprise the following steps: a substrate containing layer A) is placed in an epitaxy apparatus, in particular a metal-organic vapor-phase epitaxy (MOVPE) apparatus, a carrier gas, preferably nitrogen or hydrogen, is loaded with educts in defined concentrations according to the given composition of a layer A), B), C), D), and E), if applicable also F), or the partial layers thereof, the loaded carrier gas is conducted over the surface of the substrate heated to a temperature in the range from of 300° C. to 800° C., in particular 400° C. to 625° C. in the case of layers C) and D) or the partial layers thereof, or 525° C. to 725° C. in the case of layer E) or the partial layers thereof, or on the surface of the uppermost layer on the substrate for a defined time of exposure, wherein the total concentration of the educts and the time of exposure are adjusted to each other such that the semiconductor layer with a given layer thickness is epitaxially formed on the surface of the substrate or the surface the uppermost layer on the substrate.

Layer C) may be grown in partial layers, and between the growth of two partial layers and/or after the growth of the last partial layer, baking of the substrate to 550° C. to 750° C., in particular to 600° C. to 725° C., may occur.

As educts can be used: C1-C5 trialkyl gallium, in particular triethyl gallium ($Ga(C_2H_5)_3$), tritertiary-butyl gallium and/or trimethyl gallium ($Ga(CH_3)_3$) as Ga educt, diborane ($B_2H_6$) or C1-C5 trialkyl borane, in particular triethyl borane ($B(C_2H_5)_3$) and tritertiary-butyl borane and/or borane-amine adducts such as dimethyl aminoborane as B educt, alane-amine adducts such as dimethyl ethylamine alane or C1-C5 trialkyl aluminum, in particular trimethyl aluminum ($Al(CH_3)_3$) and tritertiary-butyl aluminum as Al educt, C1-C5 trialkyl indium, in particular trimethyl indium ($In(CH_3)_3$) as In educt, phosphine ($PH_3$) and/or C1-C5 alkyl phosphine, in particular tertiary-butyl phosphine (TBP) (t-($C_4H_9$)—$PH_2$) as P educt, arsine ($AsH_3$) and/or C1-C5 alkyl arsine, in particular tertiary-butyl arsine (TBAs) (t-($C_4H_9$)—$AsH_2$) and/or trimethyl arsine ($As(CH_3)_3$) as As educt, C1-C5 trialkyl antimony, in particular triethyl antimony ($Sb(C_2H_5)_3$) and/or trimethyl antimony ($Sb(CH_3)_3$) as Sb educt, ammonia ($NH_3$), mono(C1-C8)alkyl hydrazine, in particular tertiary-butyl hydrazine (t-($C_4H_9$)$NH_2$) and/or 1,1-di(C1-C5)alkyl hydrazine, in particular 1,1-dimethyl hydrazine (($CH_3$)$2$-N—$NH_2$) as N educt, wherein the C3-C5 alkyl groups may be linear or branched.

Educts for doping are: diethyl tellurium (DETe), dimethyl zinc (DMZn), diethyl zinc (DEZn), ditertiary-butyl silane (DitButSi), silane, ditertiary-butyl sulfide, bis-cyclopentadienyl magnesium, tetrabromomethane.

The total pressure of carrier gas and educts may be in the range from of 10 to 1,000 hPa, in particular 50 to 500 hPa, wherein the proportion of the sum of the partial pressures of the educts to the partial pressure of the carrier gas is between 1*10E-6 and 0.5, and wherein the deposition rate is 0.01 to 10 μm/h, in particular 0.05 to 5 μm/h.

The invention thus also comprises a novel epitaxy method, wherein the use of metal-organic group V starting substances permits the use of extremely low deposition temperatures. Low crystal growth temperatures are particularly important, in order to be able to realize the lattice mismatch in a very thin buffer layer. Since these metal-organic group V precursors such as TBAs and TBP are liquid at room temperature, handling in the production is substantially safer than the use of the usual gaseous and highly toxic starting substances arsine and phosphine. Furthermore, the maintenance times of epitaxy machines can be reduced, since parasitic deposits in the waste gas raw system are significantly reduced. Overall, this novel epitaxy method thus offers significant economic advantages in mass production.

Finally, the invention relates to the use of a semiconductor structure according to the invention for producing a III/V semiconductor component such as a III/V channel transistor on a silicon substrate, wherein the III/V channel of the transistor preferably forms layer F) and is epitaxially grown, as well as to a semiconductor structure obtainable by a method according to one of the claims of the invention.

The explanations with regard to the semiconductor structure according to the invention can also be used in an analogous manner for the method and vice versa.

An independent importance also has a combination of layers C), D), and E) according to the claims as a buffer layer, and that independently from the features of the further layers according to the claims.

In the following, the invention is explained in more detail with reference to non-limiting examples of execution.

Example 1.1: Layer C), First Variant

In this Example and in all following Examples, a CCS (close couple showerhead) Crius MOVPE system obtained from Aixtron is used.

The template to be used consists of a 60 nm thick GaP layer on a (001) exactly oriented silicon substrate. In the first step, the template is baked at 675° C. for 5 min under tertiary-butyl phosphine (TBP) stabilization. The reactor pressure is 100 mbar, the total flow is 48 l/min and the TBP flow is 1E-3 mol/min. Reactor pressure and total flow are held constant in the complete process.

In the following step, the wafer temperature for the growth of the relaxation layer (layer C)) is lowered to 500° C., and the mole flows of Al, P and Sb for the precipitation of AlPSb are adjusted. The growth mode may be continuous, preferably by means of flow rate modulation epitaxy (FME) or by means of atomic layer deposition (ALD). Correspondingly, the trimethyl aluminum (TMAl) mole flow is adjusted such that per second one monolayer Al occupies the substrate surface. The (TESb+TBP)/TMAl proportion (TESb=triethyl antimony) is 20, whereas the TESb/(TBP+TESb) proportion is adjusted such that in every layer the desired composition of the group V elements is realized.

Overall, the first layer package (relaxation layer) is composed of 6 individual layers. The individual layer thickness is 50 nm each. Every layer is deposited in the FME mode, and then a baking step is carried out. After baking, the wafer temperature is reduced again to 500° C., and the mole flows are activated for the next precipitation. Baking takes place under TBP stabilization, whereas the precursor TESb is enabled for the precipitation only in the reactor. Baking is carried out at a temperature of 675° C. for 1 min.

The six individual AlSbP layers have the following Sb concentrations:
1) 15%
2) 30%
3) 45%
4) 60%
5) 68%
6) 60%

After the last baking step, the precipitation of the relaxation layer is complete. In particular, the method parameters are as follows:

Total gas flow 48 l/min, reactor pressure 100 mbar, wafer temperature 500° C., baking temperature 675° C., and baking time 1 min.

Example 1.2: Layer C), Second Variant

In this Example and in all following Examples, a CCS Crius MOVPE system obtained from Aixtron is used.

The template to be used consists of a 60 nm thick GaP layer on a (001) exactly oriented silicon substrate. In the first step, the template is baked at 675° C. for 5 min under tertiary-butyl phosphine (TBP) stabilization. The reactor pressure is 100 mbar, the total flow is 48 l/min and the TBP flow is 1E-3 mol/min. Reactor pressure and total flow are held constant in the complete process.

In the following step, the wafer temperature for the growth of the relaxation layer (layer C)) is lowered to 500° C., and the mole flows of Al, P and Sb for the precipitation of AlPSb are adjusted. The growth mode may be continuous, preferably by means of flow rate modulation epitaxy (FME) or by means of atomic layer deposition (ALD). Correspondingly, the trimethyl aluminum (TMAl) mole flow is adjusted such that per second one monolayer Al occupies the substrate surface. The (TESb+TBP)/TMAl proportion (TESb=triethyl antimony) is 20, whereas the TESb/(TBP+TESb) proportion is adjusted such that in every layer the desired composition of the group V elements is realized.

Overall, the first layer package (relaxation layer) is composed of 5 individual layers. All ternary individual layer are 50 nm thick, only the thickness of the binary individual layer AlSb is selected such that baking causes a partial relaxation to the desired lattice constant of the semiconductor material of the n-channel layer. This means in this Example that the AlSb layer is not completely relaxed and still has a lattice constant smaller than AlSb, but identical with that of the n-channel layer. Every layer is deposited in the FME mode, and then a baking step is carried out. After baking, the wafer temperature is reduced again to 500° C., and the mole flows are activated for the next precipitation. Baking takes place under TBP stabilization, whereas the precursor TESb is enabled for the precipitation only in the reactor. Baking is carried out at a temperature of 675° C. for 1 min.

The six individual AlSbP layers have the following Sb concentrations:
1) 25%
2) 50%
3) 75%
4) 100%
5) 60%

After the last baking step, the precipitation of the relaxation layer is complete. In particular, the method parameters are as follows:

Total gas flow 48 l/min, reactor pressure 100 mbar, wafer temperature 500° C., baking temperature 675° C., and baking time 1 min.

Example 1.3: Layer C), Third Variant

In this Example and in all following Examples, a CCS Crius MOVPE system obtained from Aixtron is used.

The template to be used consists of a 60 nm thick GaP layer on a (001) exactly oriented silicon substrate. In the first step, the template is baked at 675° C. for 5 min under tertiary-butyl phosphine (TBP) stabilization. The reactor pressure is 100 mbar, the total flow is 48 l/min and the TBP flow is 1E-3 mol/min. Reactor pressure and total flow are held constant in the complete process.

In the following step, the wafer temperature for the growth of the relaxation layer (layer C)) is lowered to 500° C., and the mole flows of Al, In, P (or Sb) for the precipitation of AlInPSb are adjusted. The growth mode may be continuous, preferably by means of flow rate modulation epitaxy (FME) or by means of atomic layer deposition (ALD). Correspondingly, the sum of the group III mole flows, here TMAl and trimethyl indium (TMIn), is adjusted such that per second one monolayer group III elements occupies the substrate surface. The TMAl/(TMAl+TMIn) proportion and the TESb/(TBP+TESb) proportion are adjusted such that in every layer the desired composition of the group III and group V elements is realized.

Overall, the first layer package (relaxation layer) is composed of 6 individual layers. The individual layer thickness is 50 nm each. Every layer is deposited in the FME mode, and then a baking step is carried out. After baking, the wafer temperature is reduced again to 500° C., and the mole flows are activated for the next precipitation. Baking takes place under TBP stabilization, whereas the precursor TESb is enabled for the precipitation only in the reactor. Baking is carried out at a temperature of 650° C. for 1 min.

The six individual AlInP layers have the following In concentrations:
1) 25%
2) 50%
3) 75%
4) 100%
5) 100%, wherein in this layer Sb is also built in (w=0.08, v=0.92)
6) 100%

After the last baking step, the precipitation of the relaxation layer is complete. In particular, the method parameters are as follows:

Total gas flow 48 l/min, reactor pressure 100 mbar, wafer temperature 500° C., baking temperature 675° C., and baking time 1 min.

Example 2.1: Layer D, First Variant

For the growth of the misfit dislocation blocker layer, the wafer temperature is adjusted to 575° C. The TMAl mole flow is adjusted for a continuous growth mode (normal precipitation) of 2 μm/h at 575° C. Furthermore, the TEB flow is adjusted such that 2% boron are built in.

The misfit dislocation blocker layer is composed of 2 layers, which are deposited successively without growth interruption or a baking step. The composition (percentages respectively referred to 100% group III or group V elements) and layer thickness is as follows:
1) 50 nm, B 2% Al 98% P 40% Sb 60%
2) 50 nm, B 2% Al 98% P 34.1% Sb 65.9%

Growth rate is 2 μm/h (normal mode), total gas flow 48 l/min, reactor pressure 100 mbar, and wafer temperature 575° C. Layer 1) is facing toward layer C).

Example 2.2: Layer D, Second Variant

The procedure in 2.2 is analogous to Example 2.1. The misfit dislocation blocker layer is composed of 2 layers, which are deposited successively without growth interruption or a baking step. In this Example, the group III atoms consist of indium only. Instead of TEB, the 1,1-dimethyl hydrazine flow (UDMHy) is adjusted such that 2% nitrogen are built in on the side of group V.

The composition and layer thickness is as follows:
1) 50 nm, N 2% P 98% In 100%
2) 50 nm, N 2% Sb 5.9% P 92.1% In 100%

Layer 1) is facing toward layer C).

Example 3.1: Layer E), First Variant

The last layer package (the buffer layer) consists of a ternary AlPSb layer with a thickness of 50 nm. Growth temperature, reactor pressure and flow settings are identical with the parameters for the precipitation of the misfit dislocation blocker layer. The composition of 100% Al, 40% P and 60% Sb leads to the specific lattice constant for the integration of the n-channel layer. Settings as in Example 2.1, however growth rate is 1 μm/h.

Example 3.2: Layer E), Second Variant

The last layer package (the buffer layer) here consists of a ternary AlPSb layer according to Example 3.1 with a thickness of 10 nm as the partial layer facing toward layer D) and a 40 nm thick partial layer with the composition $AlAs_{0.56}Sb_{0.44}$. Growth temperatures, reactor pressure and flow settings are identical to the parameters for the precipitation of the misfit dislocation blocker layer, however the growth rate is 1 μm/h.

The invention claimed is:

1. A monolithic integrated semiconductor structure comprising:
   A) a carrier layer including doped or undoped Si,
   B) a layer having the composition $B_xAl_yGa_zN_tP_v$, wherein x=0-0.1, y=0-1, z=0-1, t=0-0.1 and v=0.9-1,
   C) a relaxation layer having the composition $B_xAl_yGa_zIn_uP_vSb_w$, wherein x=0-0.1, y=0-1, z=0-1, u=0-1, v=0-1 and w=0-1, wherein w and/or u is on the side facing toward layer A) or B) smaller than, equal to, or bigger than on the side facing away from layer A) or B) and varies or is constant within the relaxation layer, and wherein v=1−w and/or y=1−u−x−z,
   and
   D) an additional semiconductor material, or a combination of different semiconductor materials,
   wherein the sum of stoichiometric indices for all group III elements is equal to 1 and wherein the sum of stoichiometric indices for all group V elements is equal to 1, wherein the compositions of layers C), E), and F) are selected such that the lattice constant of one of layers E) and/or F) and/or of the side of layer C) facing away from layer A) or B) substantially corresponds to the lattice constant of layer F).

2. The semiconductor structure according to claim 1, wherein layer A) on a side facing toward layer B) or C) is a Si 001 surface of a Si monocrystal.

3. The semiconductor structure according to claim 1, wherein layer B) has a thickness of 20-100 nm and a p- or n-doping concentration of $1*10^{15}-1*10^{21}$ cm$^{-3}$.

4. The semiconductor structure according to claim 1 wherein layer B) has a composition selected from the group consisting of:
   z=v=1, x=y=t=0 or
   y=v=1, x=z=t=0 or
   x=0.01-0.1, y=0.90-0.99, z=t=0, v=1 or
   x=0.01-0.1, z=0.90-0.99, y=t=0, v=1 or
   t=0.01-0.1, v=0.90-0.99, y=x=0, z=1.

5. The semiconductor structure according to claim 1, wherein in layer C) w and/or u is on a side facing toward layer A) or B) smaller than on the side facing away from layer A) or B) and in the direction of a location coordinate that is orthogonal to main faces of the layer C) passes a maximum, wherein w and/or u in the maximum may be larger than on the side facing away from layer A) or B).

6. The semiconductor structure according to claim 1, wherein layer C) includes a plurality of partial layers, wherein w and/or u is variable or constant within a partial layer.

7. The semiconductor structure according to claim 1, wherein layer C) has a thickness of 1-500 nm and has a p- or n-doping concentration of $1*10^{15}$-$1*10^{21}$ cm$^{-3}$.

8. The semiconductor structure according to claim 1, wherein layer C) or partial layers thereof have a composition selected from the group consisting of:
y=1, x=z=u=0, v=1−w and
x=z=0, y=1−u, v+w=1.

9. The semiconductor structure according to claim 1 further comprising E) a layer for blocking misfit dislocations and having the composition $B_xAl_yGa_zIn_uP_vSb_wN_t$, wherein x=0-0.1, y=0-1, z=0-1, u=0-1, v=0-1, w=0-1 and t=0-0.1.

10. The semiconductor structure according to claim 9, wherein layer E) has a thickness of 1-150 nm and is undoped and/or has a p- or n-doping concentration of $1*10^{15}$-$1*10^{21}$ cm$^{-3}$.

11. The semiconductor structure according to claim 9, wherein layer E) includes 1-10 layers.

12. The semiconductor structure according to claim 9, wherein layer E) or the partial layers thereof has a composition selected from the group consisting of:
x=0-0.1, y=0.9-1, v=0-0.7, w=0.3-1, z=u=t=0 or
u=1, w=0-0.5, v=0.5-1, t=0-0.1, x=y=z=0 or
y=1, v=0-0.7, w=0.3-1, t=0-0.1, x=z=u=0 or
u=0.9-1, x=0-0.1, v=0.5-1, w=0-0.5, y=z=t=0.

13. The semiconductor structure according to claim 9 further comprising F) a layer for hetero-offset having the composition $B_xAl_yGa_zIn_uP_vSb_wN_tAs_r$, wherein x=0-0.1, y=0-1, z=0-1, u=0-1, v=0-1, w=0-1, t=0-0.1 and r=0-1.

14. The semiconductor structure according to claim 13, wherein the additional semiconductor material is a group III/V material.

15. The semiconductor structure according to claim 13, wherein layer F) has a thickness of 5-200 nm and is undoped and/or has a p- or n-doping concentration of $1*10^{15}$-$1*10^{21}$ cm$^{-3}$.

16. The semiconductor structure according to claim 13, wherein layer F) includes 2-5 layers.

17. The semiconductor structure according to claim 13, wherein layer F) has a composition selected from the group consisting of:
y=1, v=0.2-0.5, w=0.5-0.8, x=z=u=t=r=0 or
y=1, w=0.4-0.8, r=0.2-0.6, x=z=u=v=t=0.

\* \* \* \* \*